United States Patent
Chang et al.

(10) Patent No.: US 12,205,832 B2
(45) Date of Patent: Jan. 21, 2025

(54) SUBSTRATE DEBONDING APPARATUS

(71) Applicant: SAMSUNG ELECTRONICS CO., LTD., Suwon-si (KR)

(72) Inventors: Jonghyeon Chang, Pyeongtaek-si (KR); Hyunah Kim, Cheonan-si (KR); Younghyun You, Seoul (KR); Younghwan Jin, Asan-si (KR); Junho Choi, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 17/718,635

(22) Filed: Apr. 12, 2022

(65) Prior Publication Data
US 2023/0052565 A1 Feb. 16, 2023

(30) Foreign Application Priority Data
Aug. 12, 2021 (KR) .......... 10-2021-0106945

(51) Int. Cl.
*H01L 21/67* (2006.01)
*H01L 21/687* (2006.01)

(52) U.S. Cl.
CPC .. *H01L 21/67092* (2013.01); *H01L 21/68721* (2013.01)

(58) Field of Classification Search
CPC ......... H01L 21/67092; H01L 21/68721; H01L 21/6835; B23K 26/53
USPC ....................................................... 156/753
See application file for complete search history.

(56) References Cited

U.S. PATENT DOCUMENTS

| | | | |
|---|---|---|---|
| 7,846,847 B2 | 12/2010 | Park et al. | |
| 8,181,688 B2 | 5/2012 | Johnson et al. | |
| 9,895,847 B2 | 2/2018 | Te et al. | |
| 9,895,871 B2 | 2/2018 | Shih et al. | |
| 10,217,653 B2 | 2/2019 | Baek et al. | |
| 10,403,598 B2 * | 9/2019 | Bayless | H01L 23/562 |
| 10,490,525 B1 | 11/2019 | Chen et al. | |

FOREIGN PATENT DOCUMENTS

| | | |
|---|---|---|
| CN | 110034050 | 7/2019 |
| KR | 10-2016-0137836 | 12/2016 |
| KR | 10-2327167 | 11/2021 |

* cited by examiner

*Primary Examiner* — James D Sells
(74) *Attorney, Agent, or Firm* — F. CHAU & ASSOCIATES, LLC

(57) ABSTRACT

A substrate debonding apparatus includes a chuck attached to a second surface opposite to the first surface of the semiconductor substrate via a second adhesive layer. The chuck is configured to support a lower portion of a base film having a cross-sectional area in a horizontal direction greater than a cross-sectional area of the semiconductor substrate in the horizontal direction. The semiconductor debonding apparatus further includes a fixing ring arranged above the chuck and configured to fix in position an edge portion of the base film, and a cover ring arranged above the fixing ring and configured to adjust a diameter of an opening exposing the carrier substrate. The cover ring includes a guide frame arranged above the fixing ring, and a plurality of cover blades configured to move in a horizontal direction determined by the guide frame.

20 Claims, 17 Drawing Sheets

SUBSTRATE DEBONDING APPARATUS

CROSS-REFERENCE TO RELATED APPLICATIONS

This application claims priority under 35 U.S.C. § 119 to Korean Patent Application No. 10-2021-0106945, filed on Aug. 12, 2021, in the Korean Intellectual Property Office, the disclosure of which is incorporated by reference herein in its entirety.

TECHNICAL FIELD

The inventive concept relates to a substrate debonding apparatus, and more particularly, to a substrate debonding apparatus configured to separate a carrier substrate from a semiconductor substrate.

DISCUSSION OF RELATED ART

A semiconductor substrate is a solid material onto which other materials may be adhered to form a base for a semiconductor device. Semiconductor substrates have been manufactured with smaller thicknesses in response to a demand for smaller semiconductor devices. A carrier substrate may be attached to a surface of the semiconductor substrate to facilitate handling of the semiconductor substrate. For example, the carrier substrate may be attached to the surface of the semiconductor substrate through an adhesive layer. The carrier substrate may be removed from the semiconductor substrate in a substrate debonding process. However, a carrier substrate, semiconductor device, and conventional substrate debonding apparatus used in the substrate debonding process may be damaged by the process.

SUMMARY

The inventive concept provides a substrate debonding apparatus capable of preventing physical damage to a carrier substrate due to particles that may be generated by a semiconductor device during a substrate debonding process.

The inventive concept also provides a substrate debonding apparatus configured to control movement of particles that may be generated by a semiconductor device during a substrate debonding process.

The inventive concept also provides a substrate debonding apparatus that is applicable to a semiconductor device that is provided in various sizes.

According to at least one embodiment of the inventive concept, a substrate debonding apparatus is provided. The substrate debonding apparatus is configured to separate a carrier substrate of a semiconductor device from a first adhesive layer of the semiconductor device. The substrate debonding apparatus includes a chamber including an internal space and a chuck configured to support a base film of the semiconductor device in the internal space of the chamber. The semiconductor device includes a semiconductor substrate including a first surface extending in a horizontal direction and a second surface opposite to the first surface and extending in the horizontal direction, the first adhesive layer, a laser-responsive layer arranged on the first adhesive layer, the carrier substrate, and a second adhesive layer arranged on the second surface and having a cross-sectional area in the horizontal direction greater than a cross-sectional area of the semiconductor substrate in the horizontal direction. The first adhesive layer is arranged on the first surface of the semiconductor substrate, the carrier substrate is arranged on the laser-responsive layer, and the base film is arranged under the second adhesive layer. The semiconductor debonding apparatus further includes a light source configured to provide light to the laser-responsive layer of the semiconductor device, a fixing ring arranged above the chuck and configured to support an edge portion of the semiconductor device, and a cover ring arranged above the fixing ring and overlapping a portion of the second adhesive layer in a vertical direction perpendicular to the horizontal direction, the portion of the second adhesive layer arranged outside the carrier substrate. The cover ring is configured to adjust a diameter of an opening exposing the carrier substrate and includes a guide frame arranged above the fixing ring, and a cover blade configured to move in a horizontal direction determined by the guide frame.

According to at least one embodiment of the inventive concept, a substrate debonding apparatus is provided. The substrate debonding apparatus is configured to separate a carrier substrate from a first adhesive layer, the carrier substrate being attached to a first surface of a semiconductor substrate via the first adhesive layer. The substrate debonding apparatus includes a chuck attached to a second surface opposite to the first surface of the semiconductor substrate via a second adhesive layer. The chuck is configured to support a lower portion of a base film having a cross-sectional area in a horizontal direction greater than a cross-sectional area of the semiconductor substrate in the horizontal direction. The semiconductor debonding apparatus further includes a fixing ring arranged above the chuck and configured to fix in position an edge portion of the base film, and a cover ring arranged above the fixing ring and configured to adjust a diameter of an opening exposing the carrier substrate. The cover ring includes a guide frame arranged above the fixing ring, and a plurality of cover blades configured to move in a horizontal direction determined by the guide frame.

According to at least one embodiment of the inventive concept, a substrate debonding apparatus is provided. The substrate debonding apparatus is configured to separate a carrier substrate from a first adhesive layer, the carrier substrate being attached to a first surface of a semiconductor substrate through the first adhesive layer. The substrate debonding apparatus includes a chamber including an internal space, and a chuck attached to a second surface opposite to the first surface of the semiconductor substrate via a second adhesive layer. The chuck is configured to support a lower portion of a base film having a cross-sectional area in a horizontal direction greater than a cross-sectional area of the semiconductor substrate in the horizontal direction, and arranged in the internal space of the chamber. The substrate debonding apparatus further includes a fixing ring arranged above the chuck and configured to fix an edge portion of the base film, a cover ring arranged above the fixing ring and overlapping a portion of the second adhesive layer in a vertical direction perpendicular to the horizontal direction, the portion of the second adhesive layer being provided outside the carrier substrate, a pipe arranged below the cover ring and connecting the internal space of the chamber to a space outside of the chamber, and a pump connected to the pipe and configured to provide suction pressure to the pipe.

A cover ring of a substrate debonding apparatus according to at least one embodiment of the inventive concept may be arranged above a fixing ring to overlap a portion of a semiconductor device (e.g., an adhesive layer) exposed in an internal space of a chamber in a vertical direction. Accordingly, a phenomenon in which particles are generated as a result of breaking the adhesive layer may be reduced. Also, a phenomenon in which the particles are scattered in the internal space of the chamber may be suppressed, and thus, contamination of a carrier substrate and components included in the substrate debonding apparatus due to the particles may be reduced.

A cover ring of a substrate debonding apparatus according to at least one embodiment of the inventive concept may include a plurality of cover blades configured to control a size of a diameter of an opening exposing a semiconductor device. Accordingly, the substrate debonding apparatus may be applied to a substrate debonding process of a semiconductor device provided in various sizes.

A cover ring of a substrate debonding apparatus according to at least one embodiment of the inventive concept may contact an edge portion of a carrier substrate of a semiconductor device by moving in the vertical direction. Accordingly, the substrate debonding apparatus may reduce slipping of the carrier substrate of the semiconductor device in a substrate debonding process, and a yield of the substrate debonding process using the substrate debonding apparatus may be increased.

In at least one embodiment, a substrate debonding apparatus includes a pipe and a pump configured to control airflow in an internal space of a chamber. Therefore, particles generated in a substrate debonding process may be discharged to outside of the chamber through the pipe. Accordingly, contamination of a carrier substrate and components included in the substrate debonding apparatus due to the particles may be reduced.

BRIEF DESCRIPTION OF THE DRAWINGS

The above and other features of the inventive concept will become more apparent by describing in detail embodiments thereof with reference to the accompanying drawings, in which.

DETAILED DESCRIPTION

Figure 1:
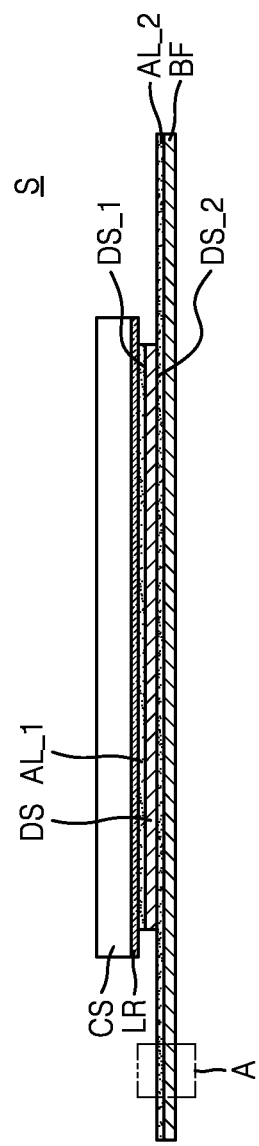
FIG. 1 is a cross-sectional view of a semiconductor device processed by a substrate debonding apparatus.

Embodiments of the inventive concept will be described more fully hereinafter with reference to the accompanying drawings. Like reference numerals may refer to like elements throughout the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

As used herein, the singular forms "a," "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a cross-sectional view of a semiconductor device S processed by a substrate debonding apparatus. Referring to FIG. 1, the semiconductor device S may include a semiconductor substrate DS, a first adhesive layer AL_1, a laser-responsive layer LR, a carrier substrate CS, a second adhesive layer AL_2, and a base film BF.

In some embodiments, the semiconductor substrate DS is a wafer on which semiconductor devices are formed. In some embodiments the semiconductor substrate DS includes a printed circuit board (PCB). A thickness of the semiconductor substrate DS may be less than or equal to about 100 micrometers in order to satisfy a demand for very small electronic components. To facilitate handling of the semiconductor substrate DS and reduce physical damage to the semiconductor substrate DS in a processing process of the semiconductor substrate DS, the carrier substrate CS may be attached to a first surface DS_1 of the semiconductor substrate DS through the first adhesive layer AL_1.

Hereinafter, the term "horizontal direction" refers to a direction parallel to a direction in which an upper surface and a lower surface of the semiconductor substrate DS of the semiconductor device S extend (e.g., a width direction or width of the semiconductor substrate DS), and the term "vertical direction" refers to a direction perpendicular to the direction in which the upper surface and the lower surface of the semiconductor substrate DS of the semiconductor device S extend (e.g., a thickness direction or thickness of the semiconductor substrate DS).

The semiconductor substrate DS may include the first surface DS_1 and a second surface DS_2 extending parallel to and facing the first surface DS_1. For example, the first surface DS_1 may be the upper surface of the semiconductor substrate DS, and the second surface DS_2 may be the lower surface of the semiconductor substrate DS.

The first adhesive layer AL_1 may include an adhesive material that may attach the carrier substrate CS to the semiconductor substrate DS. In at least one embodiment, the first adhesive layer AL_1 may be a film or tape having adhesive properties. For example, the first adhesive layer AL_1 may be a dual-adhesive film or dual-adhesive tape.

In at least one embodiment, a cross-sectional area of the first adhesive layer AL_1 in the horizontal direction is substantially the same as a cross-sectional area of the semiconductor substrate DS in the horizontal direction (e.g., the first adhesive layer AL_1 may include a first width and the semiconductor substrate DS may include a second width, and the first width may equal the second width). For example, a side surface of the first adhesive layer AL_1 may be coplanar with a side surface of the semiconductor substrate DS. However, in some embodiments, a size of the cross-sectional area of the first adhesive layer AL_1 in the horizontal direction is not the same as a cross-sectional area of the semiconductor substrate DS (e.g., the first adhesive layer AL_1 may include a first width and the semiconductor substrate DS may include a second width, and the first width might not equal the second width).

The laser-responsive layer LR may be arranged on the first adhesive layer AL_1. For example, the laser-responsive layer LR may be arranged between the first adhesive layer AL_1 and the carrier substrate CS. A cross-sectional area of the laser-responsive layer LR in the horizontal direction may be greater than the cross-sectional area of the first adhesive layer AL_1 in the horizontal direction (e.g., the first adhesive layer AL_1 may include a first width and the laser-responsive layer LR may include a second width, and the second width may be greater than the first width). The cross-sectional area of the laser-responsive layer LR in the horizontal direction may be substantially the same as a cross-sectional area of the carrier substrate CS in the horizontal direction (e.g., the laser-responsive layer LR may include a first width and the carrier substrate CS may include a second width, and the first width may equal the second width).

In at least one embodiment, the laser-responsive layer LR includes a material causing a photochemical reaction (i.e., a chemical reaction due to absorption of light by the material). For example, the laser-responsive layer LR may include a material that expands upon absorbing ultraviolet rays. The ultraviolet rays are irradiated onto the laser-responsive layer LR, and expandable protrusions may be generated inside the laser-responsive layer LR via a photochemical reaction between the material and the ultraviolet rays. The expandable protrusions disposed inside the laser-responsive layer LR may decrease adhesion between the first adhesive layer AL_1 and the carrier substrate CS.

The carrier substrate CS may be a substrate attached to the first surface DS_1 of the semiconductor substrate DS through the first adhesive layer AL_1. The carrier substrate CS may facilitate handling of the semiconductor substrate DS due to their attachment. In at least one embodiment, the carrier substrate CS includes a material that transmits light. For example, the carrier substrate CS may include a glass that transmits ultraviolet rays.

In at least one embodiment, the cross-sectional area of the carrier substrate CS in the horizontal direction is greater than the cross-sectional area of the semiconductor substrate DS in the horizontal direction (e.g., the carrier substrate CS may include a first width and the semiconductor substrate DS may include a second width, and the first width may be greater than the second width). In at least one embodiment, the cross-sectional area of the carrier substrate CS in the horizontal direction is greater than the cross-sectional area of the semiconductor substrate DS in the horizontal direction and is less than a cross-sectional area of the base film BF in the horizontal direction (e.g., the carrier substrate CS may include a first width, the semiconductor substrate DS may include a second width, the base film BF may include a third width, and the first width may be greater than the second width and less than the third width).

The second adhesive layer AL_2 may include an adhesive material that may attach the base film BF to the semiconductor substrate DS. In at least one embodiment, the second adhesive layer AL_2 is a film or tape having adhesive properties. For example, the second adhesive layer AL_2 may be a dual-adhesive film or dual-adhesive tape.

In at least one embodiment, a cross-sectional area of the second adhesive layer AL_2 in the horizontal direction is substantially the same as the cross-sectional area of the base film BF in the horizontal direction (e.g., the second adhesive layer AL_2 may include a first width and the base film BF may include a second width, and the first width may equal the second width). In at least one embodiment, the cross-sectional area of the second adhesive layer AL_2 in the horizontal direction is greater than the cross-sectional area of the semiconductor substrate DS in the horizontal direction (e.g., the second adhesive layer AL_2 may include a first width and the semiconductor substrate DS may include a second width, and the first width may be greater than the second width). Accordingly, a portion of the second adhesive layer AL_2 may be outside of a side surface of the semiconductor substrate DS (e.g., a portion of the second adhesive layer AL_2 might not overlap the semiconductor substrate DS).

The base film BF may be a film configured to support the semiconductor substrate DS. In at least one embodiment, the cross-sectional area of the base film BF in the horizontal direction is greater than the cross-sectional area of the semiconductor substrate DS in the horizontal direction (e.g., the base film BF may include a first width and the semiconductor substrate DS may include a second width, and the first width may be greater than the second width).

Figure 2:
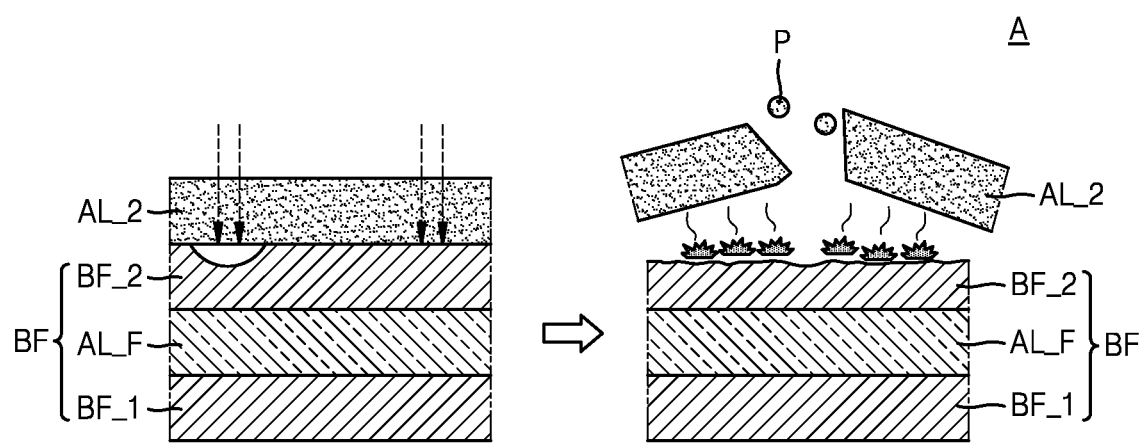
FIG. 2 is an enlarged cross-sectional view of region A of FIG. 1.

In at least one embodiment, the base film BF includes a plurality of layers. A first layer of the plurality of layers of the base film BF may include a material causing a photochemical reaction (i.e., a chemical reaction due to absorption of light by the material). When the first layer of the base film BF absorbs light, a gas may be generated by a photochemical reaction in the first layer. Referring to FIG. 2, at least a portion of the second adhesive layer AL_2 arranged on the base film BF may be broken by the gas to form particles P.

FIG. 2 is an enlarged cross-sectional view of region A of FIG. 1. Referring to FIGS. 1 and 2 together, the base film BF may include a first film layer BF_1, a film adhesive layer AL_F, and a second film layer BF_2. The second adhesive layer AL_2 may be arranged above the first film layer BF_1 of the base film BF.

The film adhesive layer AL_F may be arranged between the first film layer BF_1 and the second film layer BF_2 and may fix the second film layer BF_2 above the first film layer BF_1. In at least one embodiment, the first film layer BF_1 is configured to absorb light of a first wavelength. In at least one embodiment, the first wavelength is about 300 nanometers. In at least one embodiment, the second adhesive layer AL_2 arranged above the first film layer BF_1 is configured to transmit the light of the first wavelength.

When the light of the first wavelength is transmitted through the second adhesive layer AL_2 and is absorbed by the first film layer BF_1, a gas may be generated by a photochemical reaction in the first film layer BF_1. At least a portion of the second adhesive layer AL_2 arranged above the first film layer BF_1 may be broken by the gas. For example, the presence of the gas may cause an increase in pressure between at least a portion of the second adhesive layer AL_2 and the first film layer BF_1, causing the portion of the second adhesive layer AL_2 to separate from other portions of the second adhesive layer AL_2.

When at least a portion of the second adhesive layer AL_2 is broken by the gas, the particles P may be generated from the second adhesive layer AL_2. For example, particles P of the second adhesive layer AL_2 may break off from the rest of the second adhesive layer AL_2. In a comparative example, the particles P may be scattered in a substrate debonding process of a semiconductor device, and a carrier substrate and components included in a substrate debonding apparatus described with reference to FIG. 3 may be contaminated by the particles P.

Figure 3:
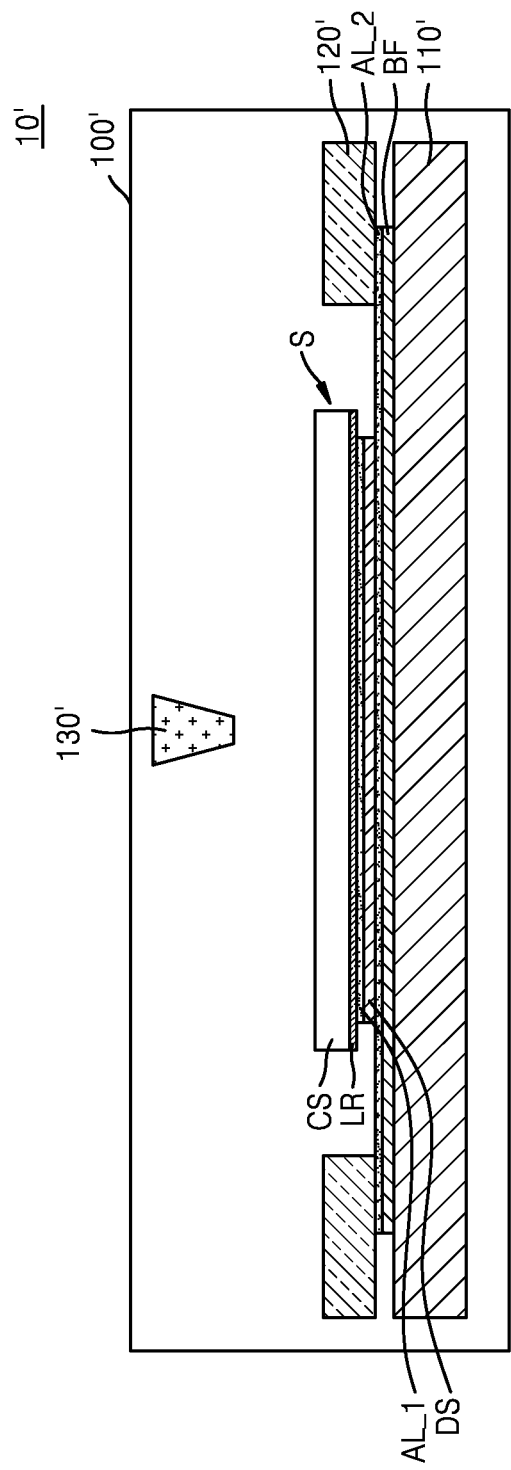
FIG. 3 is a cross-sectional view of a substrate debonding apparatus according to a comparative example.

FIG. 3 is a cross-sectional view of the substrate debonding apparatus 10' according to a comparative example. Referring to FIG. 3, the substrate debonding apparatus 10' according to the comparative example may include a chamber 100' including an internal space, a chuck 110' arranged in the internal space of the chamber 100' and configured to support the semiconductor device S, a fixing ring 120' arranged above the chuck 110' and configured to fix the semiconductor device S, and a light source 130' configured to provide light to the semiconductor device S.

When the substrate debonding apparatus 10' according to the comparative example is viewed in a plan view, a portion of the second adhesive layer AL_2 of the semiconductor device S may be exposed in the internal space of the chamber 100'. For example, when the substrate debonding apparatus 10' according to the comparative example is viewed in a plan view, a portion of the second adhesive layer AL_2 provided between the fixing ring 120' and the carrier substrate CS may be exposed in the internal space of the chamber 100'.

As described above, when light provided by the light source 130' passes through the portion of the second adhesive layer AL_2 provided between the fixing ring 120' and the carrier substrate CS and reaches the base film BF, a gas may be generated by a photochemical reaction in a surface of the base film BF. At least a portion of the second adhesive layer AL_2 may be broken by the gas to form the particles P as described with reference to FIG. 2, and the particles P may scatter inside the chamber 100' and contaminate the carrier substrate CS and the components included in the substrate debonding apparatus 10'.

Hereinafter, a substrate debonding apparatus 10 according to at least one embodiment of the inventive concept is described. In at least one embodiment, the substrate debonding apparatus 10 is configured to separate a carrier substrate from an adhesive layer of a substrate device without contaminating the substrate debonding apparatus 10 and the substrate device with particles of the adhesive layer.

Figure 4:
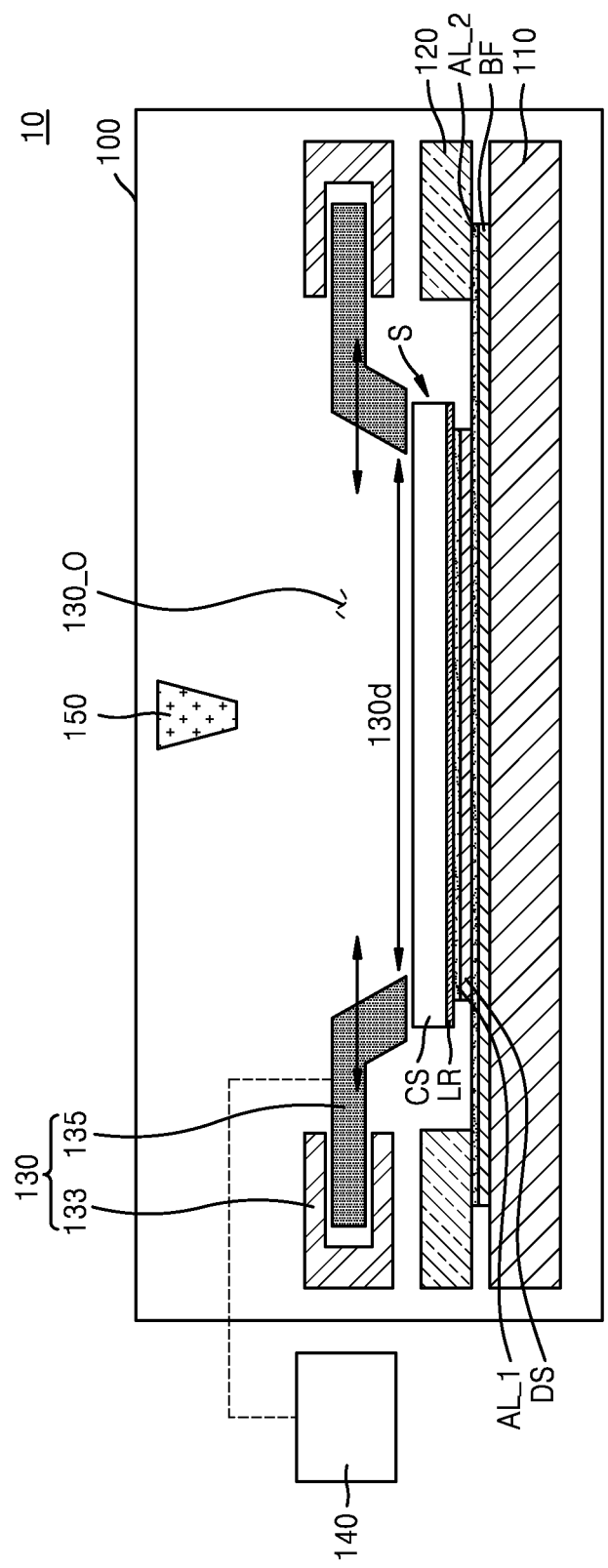
FIG. 4 is a cross-sectional view of a substrate debonding apparatus according to at least one embodiment of the inventive concept.

FIG. 4 is a cross-sectional view of the substrate debonding apparatus 10 according to at least one embodiment of the inventive concept. In at least one embodiment, the substrate debonding apparatus 10 is an apparatus configured to separate the carrier substrate CS from the first adhesive layer AL_1 by laser ablation. Referring to FIG. 4, the substrate debonding apparatus 10 may include a chamber 100, a chuck 110, a fixing ring 120, a cover ring 130, a first driver 140, and a light source 150.

A substrate debonding process may be performed in an internal space of the chamber 100. The chuck 110, the fixing ring 120, the cover ring 130, and the light source 150 may be accommodated in the internal space of the chamber 100. For example, the chuck 110, the fixing ring 120, the cover ring 130, and the light source 150 may be arranged in the internal space of the chamber 100.

The chuck 110 may be arranged in the internal space of the chamber 100 and may be configured to support the semiconductor device S. For example, the chuck 110 may support a lower portion of the base film BF of the semiconductor device S.

The fixing ring 120 may be arranged above the chuck 110 and may be configured to fix the semiconductor device S on a surface of the chuck 110. In at least one embodiment, the fixing ring 120 may be provided in a ring shape that overlaps at least a portion of the semiconductor device S arranged on the chuck 110 in the vertical direction. The fixing ring 120 may be configured to fix an edge of the semiconductor device S on the chuck 110. For example, the fixing ring 120 may press an edge portion of the second adhesive layer AL_2 of the semiconductor device S.

The cover ring 130 may be arranged above the fixing ring 120 and may overlap a portion of the semiconductor device S exposed in the internal space of the chamber 100 in the vertical direction. For example, the cover ring 130 may be arranged above the fixing ring 120 and may overlap a portion of the second adhesive layer AL_2 exposed in the internal space of the chamber 100 in the vertical direction.

In at least one embodiment, the cover ring 130 may be provided in a ring shape, and may have an opening 130_O exposing a portion of the semiconductor device S. The cover ring 130 may be configured to adjust a diameter 130d of the opening 130_O.

For example, in at least one embodiment, the cover ring 130 includes a guide frame 133 and a cover blade 135. The guide frame 133 may be arranged above the fixing ring 120 and may guide movement of the cover blade 135. In at least one embodiment, the cover blade 135 is configured to move in a horizontal direction determined by the guide frame 133 (e.g., the guide frame 133 restricts vertical movement of the cover blade 135). As the cover blade 135 moves in the horizontal direction determined by the guide frame 133, a size of the diameter 130d of the opening 130_O exposing a portion of the semiconductor device S may be adjusted.

The first driver 140 may be configured to provide power to move the cover blade 135 in the horizontal direction. For example, the first driver 140 may include a motor. In at least one embodiment, the first driver 140 is connected to the cover blade 135 by a combination of a gear and a link. In some embodiments, the first driver 140 is connected to the cover blade 135 through other suitable mechanisms capable of transmitting horizontal movement.

The light source 150 may be configured to irradiate light onto a portion of the semiconductor device S mounted on the chuck 110. For example, in at least one embodiment, the light source 150 is a laser. Light provided by the light source 150 may pass through the carrier substrate CS and reach the laser-responsive layer LR. The laser-responsive layer LR may include a material causing a photochemical reaction due to light absorption in the material. As light is irradiated onto the laser-responsive layer LR, expandable protrusions may be generated inside the laser-responsive layer LR. The expandable protrusions may decrease adhesion between the first adhesive layer AL_1 and the carrier substrate CS, and the carrier substrate CS may thus be separated from the first adhesive layer AL_1.

The cover ring 130 of the substrate debonding apparatus 10 may be arranged above the fixing ring 120 and may overlap a portion of the semiconductor device S exposed in the internal space of the chamber 100 in the vertical direction. Accordingly, the light provided by the light source 150 may be at least partially blocked by the cover ring 130, and thus, may not reach the second adhesive layer AL_2 and the base film BF exposed in the internal space of the chamber 100.

By at least partially blocking the light provided by the light source 150 from reaching the second adhesive layer AL_2 and the base film BF, a chemical reaction generating a gas in the base film BF may be reduced. Accordingly, a phenomenon in which the second adhesive layer AL_2 arranged on the base film BF is broken by the gas to generate the particles P as described with reference to FIG. 2 may be reduced. Therefore, a phenomenon in which the particles P are scattered in the internal space of the chamber 100 may be suppressed, and thus, contamination of the carrier substrate CS and components included in the substrate debonding apparatus 10 due to the particles P may be reduced.

The cover ring 130 of the substrate debonding apparatus 10 may include the guide frame 133 and the cover blade 135 configured to adjust the size of the diameter 130d of the opening 130_O exposing the semiconductor device S. Accordingly, the substrate debonding apparatus 10 may be applied to a substrate debonding process of a semiconductor device S provided in various sizes.

Figure 5:
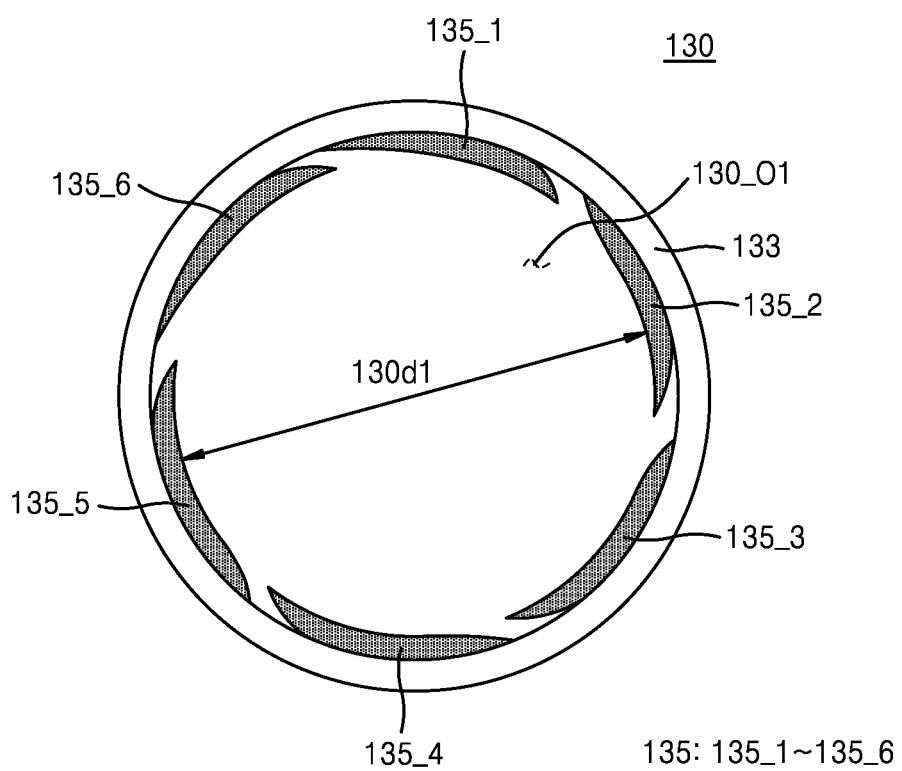
FIG. 5 is a plan view of a cover ring in a first state according to at least one embodiment of the inventive concept.
Figure 6:
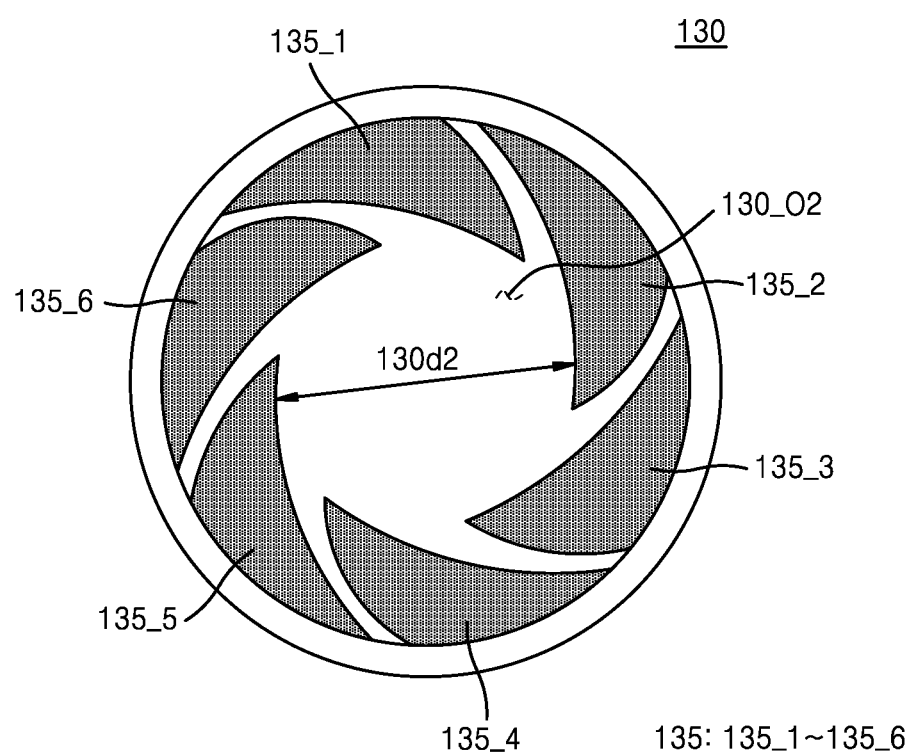
FIG. 6 is a plan view of a cover ring in a second state according to at least one embodiment of the inventive concept.

FIG. 5 is a plan view of the cover ring 130 in a first state according to at least one embodiment of the inventive concept, and FIG. 6 is a plan view of the cover ring 130 in a second state according to at least one embodiment of the inventive concept. Referring to FIGS. 5 and 6 together, the cover ring 130 may be provided in a ring shape and may include the guide frame 133 and a plurality of cover blades 135_1 to 135_6 configured to move in the horizontal direction determined by the guide frame 133.

FIGS. 5 and 6 illustrate an example in which the number of the plurality of cover blades 135_1 to 135_6 is six. In some embodiments, the number of the plurality of cover blades 135_1 to 135_6 may be four or greater.

In at least one embodiment, the plurality of cover blades 135_1 to 135_6 has an aperture structure. For example, edges of the plurality of cover blades 135_1 to 135_6 form an aperture. The size of the diameter 130d of the opening 130_O of the cover ring 130 may be adjusted based on movement of the plurality of cover blades 135_1 to 135_6 in the horizontal direction according to the aperture structure. For example, the plurality of cover blades 135_1 to 135_6 move in a horizontal direction determined by the guide frame 133 so that an aperture formed by edges of the plurality of cover blades 135_1 to 135_6 expands and contracts.

In at least one embodiment, each of the plurality of cover blades 135_1 to 135_6 may be provided in substantially the same shape. Also, the plurality of cover blades 135_1 to 135_6 may form different layers in the vertical direction so as not to interfere with each other when moving in the horizontal direction.

Referring to FIG. 5, the plurality of cover blades 135_1 to 135_6 may move a first distance in the horizontal direction determined by the guide frame 133. When the plurality of cover blades 135_1 to 135_6 move the first distance, inner portions of the plurality of cover blades 135_1 to 135_6 may form a first opening 130_O1 having a first diameter 130d1.

Referring to FIG. 6, the plurality of cover blades 135_1 to 135_6 may move a second distance that is greater than the first distance in the horizontal direction determined by the guide frame 133. When the plurality of cover blades 135_1 to 135_6 move the second distance, the inner portions of the plurality of cover blades 135_1 to 135_6 may form a second opening 130_O2 having a second diameter 130d2 that is less than the first diameter 130d1 described with reference to FIG. 5.

Because the plurality of cover blades 135_1 to 135_6 of the cover ring 130 may move in the horizontal direction determined by the guide frame 133, the cover ring 130 may control sizes of the first diameter 130d1 and the second diameter 130d2 of the first opening 130_O1 and the second opening 130_O2 exposing the semiconductor device S.

Accordingly, the substrate debonding apparatus 10 may be applied to a substrate debonding process of a semiconductor device S provided in various sizes. For example, an opening or aperture formed by the plurality of cover blades 135_1 to 135_6 may be adjusted to sizes that are appropriate for accommodating semiconductor devices of varying sizes.

Figure 7:
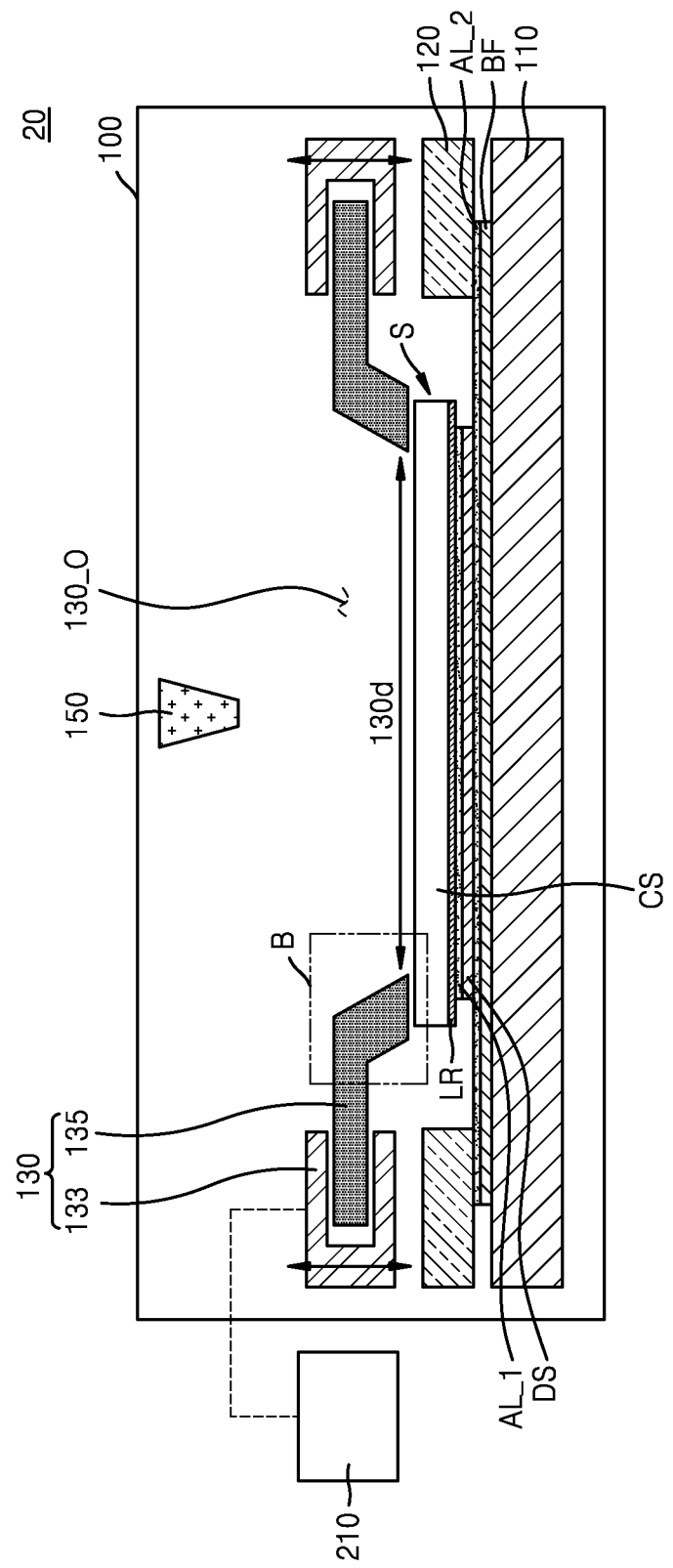
FIG. 7 is a cross-sectional view of a substrate debonding apparatus according to at least one embodiment of the inventive concept.
Figure 8:
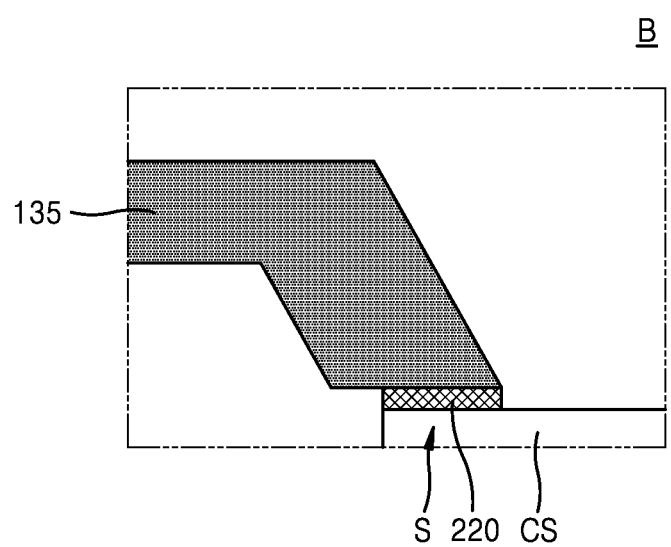
FIG. 8 is an enlarged view of region B of FIG. 7.

FIG. 7 is a cross-sectional view of a substrate debonding apparatus 20 according to at least one embodiment of the inventive concept. FIG. 8 is an enlarged view of region B of FIG. 7. Referring to FIGS. 7 and 8 together, the substrate debonding apparatus 20 may include the chamber 100, the chuck 110, the fixing ring 120, the cover ring 130, the light source 150, a second driver 210, and a buffer member 220.

Hereinafter, redundant descriptions of similarities between the substrate debonding apparatus 10 of FIG. 4 and the substrate debonding apparatus 20 of FIG. 7 may be omitted, and differences therebetween are mainly described.

The second driver 210 may be configured to provide power for movement of the cover ring 130 in the vertical direction. For example, the second driver 210 may include a motor. In at least one embodiment, the second driver 210 is connected to the cover ring 130 by a combination of a gear and a link. In some embodiments, the second driver 210 is connected to the cover ring 130 through other suitable mechanisms capable of transmitting vertical movement.

The second driver 210 may cause the cover ring 130 of the substrate debonding apparatus 20 to move in the vertical direction, and thus, a portion of the cover ring 130 of the substrate debonding apparatus 20 may contact an edge portion of the carrier substrate CS of the semiconductor device S. That is, the cover ring 130 of the substrate debonding apparatus 20 may support the edge portion of the carrier substrate CS of the semiconductor device S. For example, the cover ring 130 may restrain an edge portion of the carrier substrate CS of the semiconductor device S. In at least one embodiment, when the cover ring 130 moves in a first direction, a portion of the cover ring 130 may contact the edge portion of the carrier substrate CS of the semiconductor device S, and when the cover ring 130 moves in a second direction opposite to the first direction, a portion of the cover ring 130 may be spaced apart from the edge portion of the carrier substrate CS of the semiconductor device S.

Referring to FIG. 8, the buffer member 220 may be attached under the cover ring 130. For example, the buffer member 220 may be attached to a lower surface of the cover blade 135 and may contact a portion of the carrier substrate CS of the semiconductor device S based on movement of the cover ring 130 in the vertical direction.

In at least one embodiment, to prevent physical damage to the carrier substrate CS of the semiconductor device S, a rigidity of a material included in the buffer member 220 may be less than a rigidity of a material included in the cover ring 130. In some embodiments, a material included in the buffer member 220 may be substantially the same as a material included in the cover ring 130.

Because the cover ring 130 of the substrate debonding apparatus 20 may contact the edge portion of the carrier substrate CS of the semiconductor device S by moving in the vertical direction, the carrier substrate CS of the semiconductor device S may be prevented from slipping in a substrate debonding process. Accordingly, a yield of the substrate debonding process may be increased.

Figure 9:
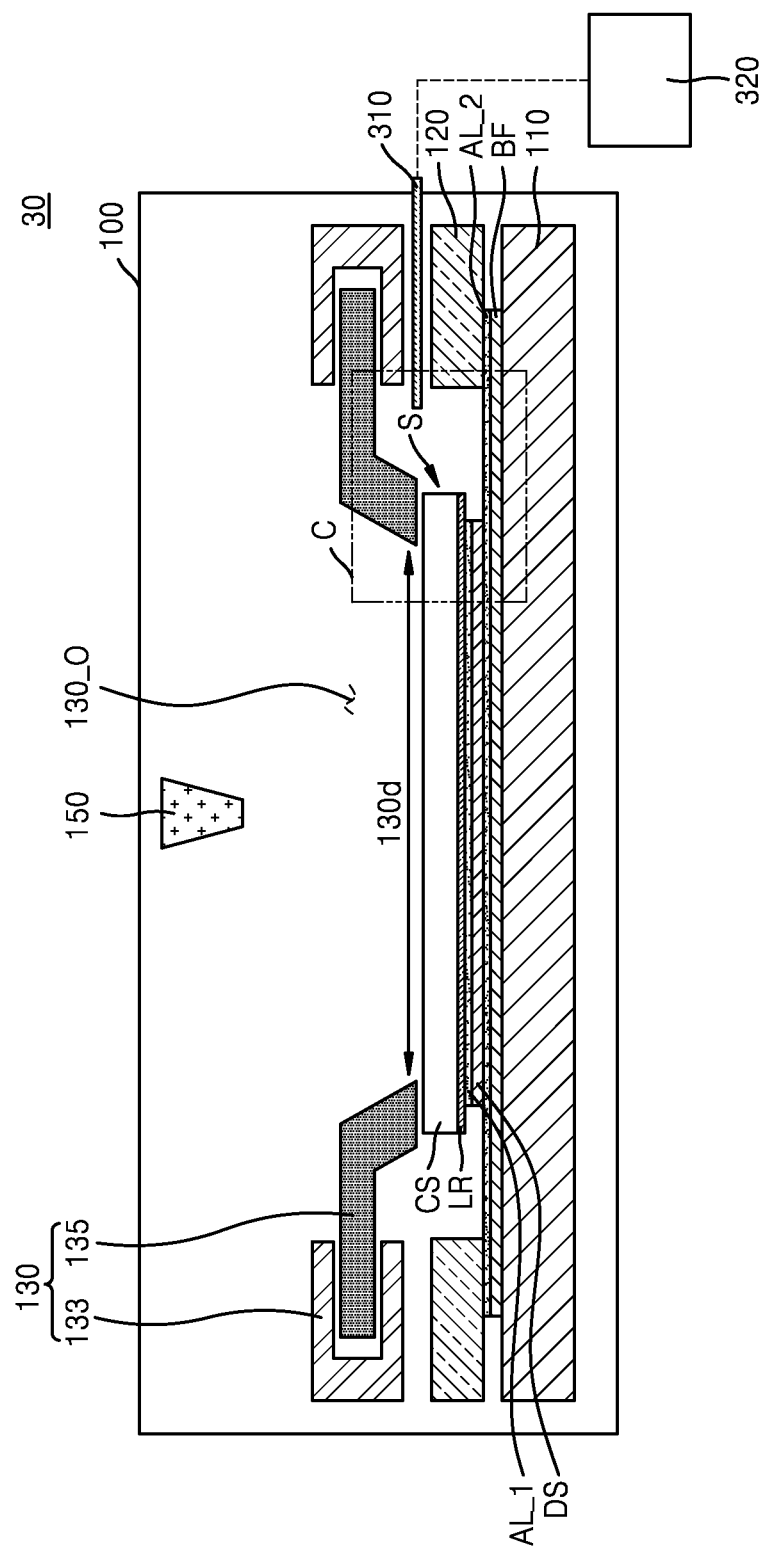
FIG. 9 is a cross-sectional view of a substrate debonding apparatus according to at least one embodiment of the inventive concept.
Figure 10:
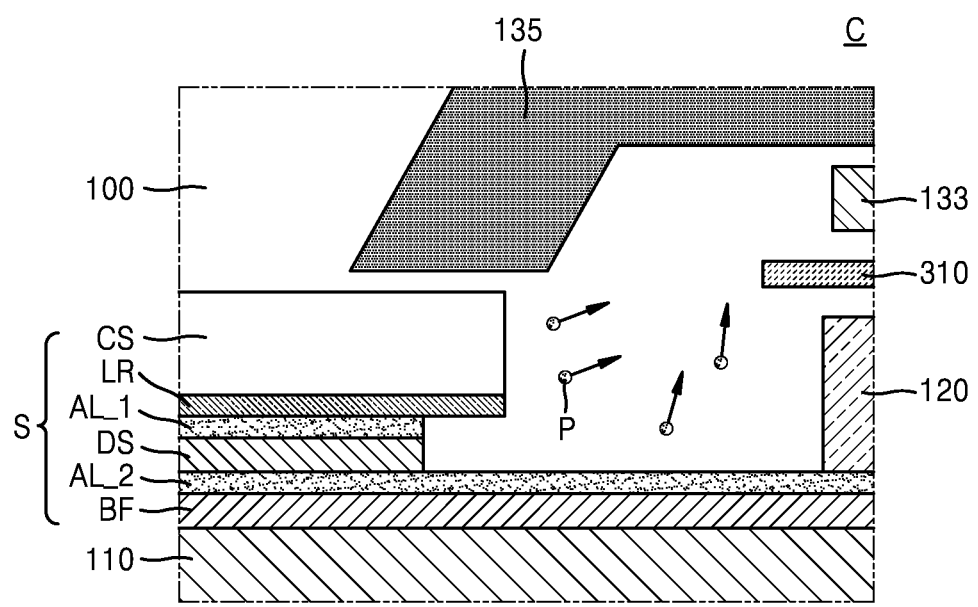
FIG. 10 is an enlarged view of region C of FIG. 9.

FIG. 9 is a cross-sectional view of a substrate debonding apparatus 30 according to at least one embodiment of the inventive concept. FIG. 10 is an enlarged view of region C of FIG. 9. The substrate debonding apparatus 30 may include the chamber 100, the chuck 110, the fixing ring 120, the cover ring 130, the light source 150, a pipe 310, and a pump 320.

Hereinafter, redundant descriptions of similarities between the substrate debonding apparatus 10 of FIG. 4 and the substrate debonding apparatus 30 of FIG. 9 may be omitted, and differences therebetween are mainly described.

The pipe 310 may be arranged above an edge portion of the semiconductor device S. For example, the pipe 310 may be arranged in a space between the fixing ring 120 and the cover ring 130. The pipe 310 may connect a space above the edge portion of the semiconductor device S in the internal space of the chamber 100 to a space outside of the chamber 100. For example, the internal space of the chamber 100 may be separated from the space outside of the chamber 100 by one or more sidewalls of the chamber 100.

The pump 320 may be connected to the pipe 310 and may be configured to provide suction pressure to the pipe 310. For example, in at least one embodiment, the pump 320 may be configured to discharge air present above the edge portion of the semiconductor device S to the space outside of the chamber 100 through the pipe 310. In at least one embodiment, the pump 320 is a vacuum pump. In some embodiments, the pump 320 may include various types of pumps.

Therefore, the pump 320 may be configured to discharge air present in the internal space of the chamber 100 to the space outside of the chamber 100 such that pressure in a space between the fixing ring 120 and the cover ring 130 in the internal space of the chamber 100 is lower than pressure in the space outside of the chamber 100.

When light provided by the light source 150 reaches the second adhesive layer AL_2 and the base film BF provided outside of the semiconductor substrate DS, at least a portion of the second adhesive layer AL_2 may be broken by a photochemical reaction of the base film BF to form the particles P.

Because the pump 320 of the substrate debonding apparatus 30 may control airflow in the internal space of the chamber 100 such that the pressure in the space between the fixing ring 120 and the cover ring 130 is lower than the pressure in the space outside of the chamber 100, the particles P may be sucked into the pipe 310 and discharged outside of the chamber 100 through the pipe 310. Accordingly, a contamination of the carrier substrate CS due to the particles P may be reduced, and a contamination of components included in the substrate debonding apparatus 30 due to the particles P may be reduced.

Figure 11:
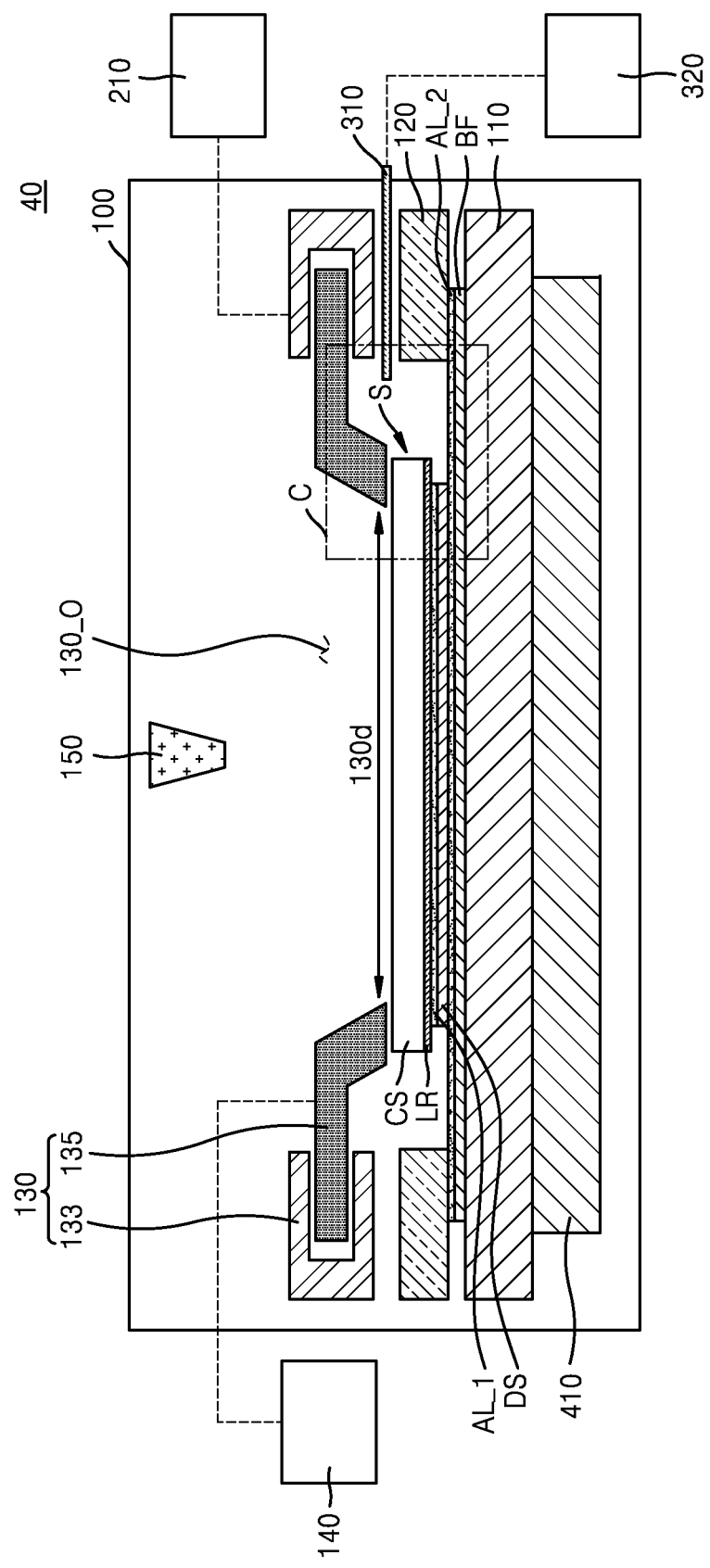
FIG. 11 is a cross-sectional view of a substrate debonding apparatus according to at least one embodiment of the inventive concept.

FIG. 11 is a cross-sectional view of a substrate debonding apparatus 40 according to at least one embodiment of the inventive concept. Referring to FIG. 11, the substrate debonding apparatus 40 may include the chamber 100, the chuck 110, the fixing ring 120, the cover ring 130, the first driver 140, the light source 150, the second driver 210, the pipe 310, the pump 320, and a stage 410.

The stage 410 may be configured to move the chuck 110 in the horizontal direction. For example, the stage 410 may be configured to move the semiconductor device S mounted on the chuck 110 in the horizontal direction during a substrate debonding process.

In at least one embodiment, the light source 150 may be fixed in the internal space of the chamber 100. To provide light emitted by the light source 150 to an entire region of the laser-responsive layer LR of the semiconductor device S, the stage 410 may be configured to move the chuck 110 in the horizontal direction while the light source 150 provides light to the semiconductor device S.

In at least one embodiment, the cover ring 130 may be provided in a ring shape and may include the guide frame 133 configured to guide movement of the cover blade 135 in the horizontal direction, and the cover blade 135 configured to move in the horizontal direction determined by the guide frame 133.

In at least one embodiment, a plurality of cover blades 135 may be provided as described with reference to FIGS. 5 and 6. The plurality of cover blades 135 may move in the horizontal direction determined by the guide frame 133 via the first driver 140. A size of the diameter 130d of the opening 130_O of the cover ring 130 may be adjusted based on movement of the plurality of cover blades 135 in the horizontal direction determined by the guide frame 133.

The cover ring 130 of the substrate debonding apparatus 40 may be arranged above the fixing ring 120 and may overlap the second adhesive layer AL_2 of the semiconductor device S exposed in the internal space of the chamber 100 in the vertical direction. Because the cover ring 130 may overlap a portion of the semiconductor device S in the vertical direction, the light provided by the light source 150 may be blocked by the cover ring 130, and thus, may be prevented from reaching the second adhesive layer AL_2 of the semiconductor device S exposed in the internal space of the chamber 100. Accordingly, a phenomenon in which the particles P are generated as a result of breaking a portion of the second adhesive layer AL_2 due to a photochemical reaction of the base film BF may be mitigated. A phenomenon in which the particles P are scattered in the internal space of the chamber 100 may therefore be suppressed, and thus, contamination of the carrier substrate CS and components included in the substrate debonding apparatus 40 due to the particles P may be reduced.

Because the plurality of cover blades 135 of the cover ring 130 of the substrate debonding apparatus 40 may move in the horizontal direction determined by the guide frame 133, the cover ring 130 may control the size of the diameter 130$d$ of the openings 130_O exposing the semiconductor device S. Accordingly, the substrate debonding apparatus 40 may be applied to a substrate debonding process of a semiconductor device S provided in various sizes.

In at least one embodiment, the cover ring 130 may be configured to move in the vertical direction via the second driver 210. Accordingly, a portion of the cover ring 130 may contact an edge portion of the carrier substrate CS of the semiconductor device S. For example, during a substrate processing process, the cover ring 130 may move in the vertical direction to contact the edge portion of the carrier substrate CS. Upon completion of the substrate processing process, the cover ring 130 may move in the vertical direction to be spaced apart from the edge portion of the carrier substrate CS.

Because the cover ring 130 of the substrate debonding apparatus 40 may contact the edge portion of the carrier substrate CS of the semiconductor device S by moving in the vertical direction, the carrier substrate CS of the semiconductor device S may be prevented from slipping in a substrate debonding process. Accordingly, a yield of the substrate debonding process may be increased.

In at least one embodiment, the pipe 310 is arranged in a space between the fixing ring 120 and the cover ring 130 and connects a space provided above an edge portion of the semiconductor device S in the internal space of the chamber 100 to a space outside of the chamber 100. The pump 320 may be connected to the pipe 310 and may be configured to provide suction pressure to the pipe 310. In at least one embodiment, the pump 320 is configured to discharge air present in the internal space of the chamber 100 to the external space of the chamber 100 such that pressure in the space between the fixing ring 120 and the cover ring 130 in the internal space of the chamber 100 is lower than pressure in the space outside of the chamber 100.

Because the pipe 310 and the pump 320 of the substrate debonding apparatus 40 may control airflow in the internal space of the chamber 100 such that the pressure in the space between the fixing ring 120 and the cover ring 130 is lower than the pressure in external space outside of the chamber 100, particles P that may be formed as a result of breaking of a portion of the second adhesive layer AL_2 may be discharged outside of the chamber 100 through the pipe 310. Accordingly, contamination of the carrier substrate CS due to the particles P may be reduced, and contamination of the components included in the substrate debonding apparatus 40 due to the particles P may be reduced.

Figure 12:
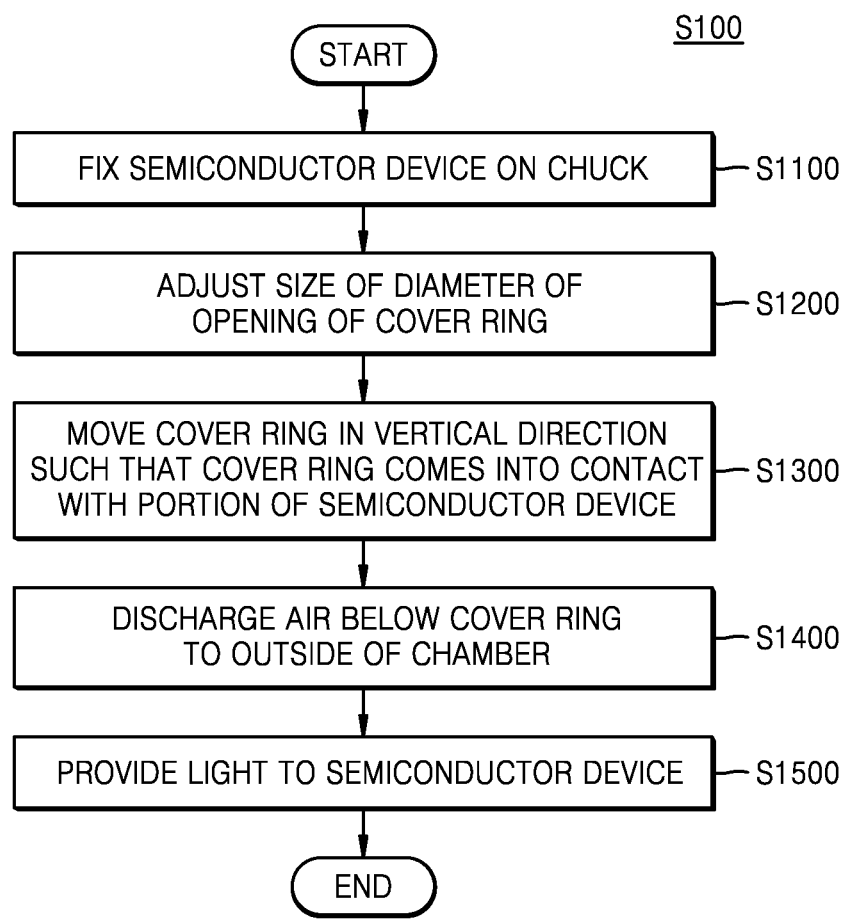
FIG. 12 is a flowchart illustrating a flow of operations in a substrate debonding process according to at least one embodiment of the inventive concept.

FIG. 12 is a flowchart illustrating a flow of operations in a substrate debonding process S100 according to at least one embodiment of the inventive concept. For example, the substrate debonding process S100 may be a process of separating the carrier substrate CS described with reference to FIG. 13 from the first adhesive layer AL_1 described with reference to FIG. 13 by laser ablation.

Referring to FIG. 12, the substrate debonding process S100 may include operation S1100 of fixing the semiconductor device S on the chuck 110, operation S1200 of adjusting a size of the diameter 130$d$ of the opening 130_O of the cover ring 130, operation S1300 of moving the cover ring 130 in the vertical direction such that the cover ring 130 comes into contact with a portion of the semiconductor device S, operation S1400 of discharging air below the cover ring 130 to outside of the chamber 100, and operation S1500 of providing light to the semiconductor device S.

Figure 13:
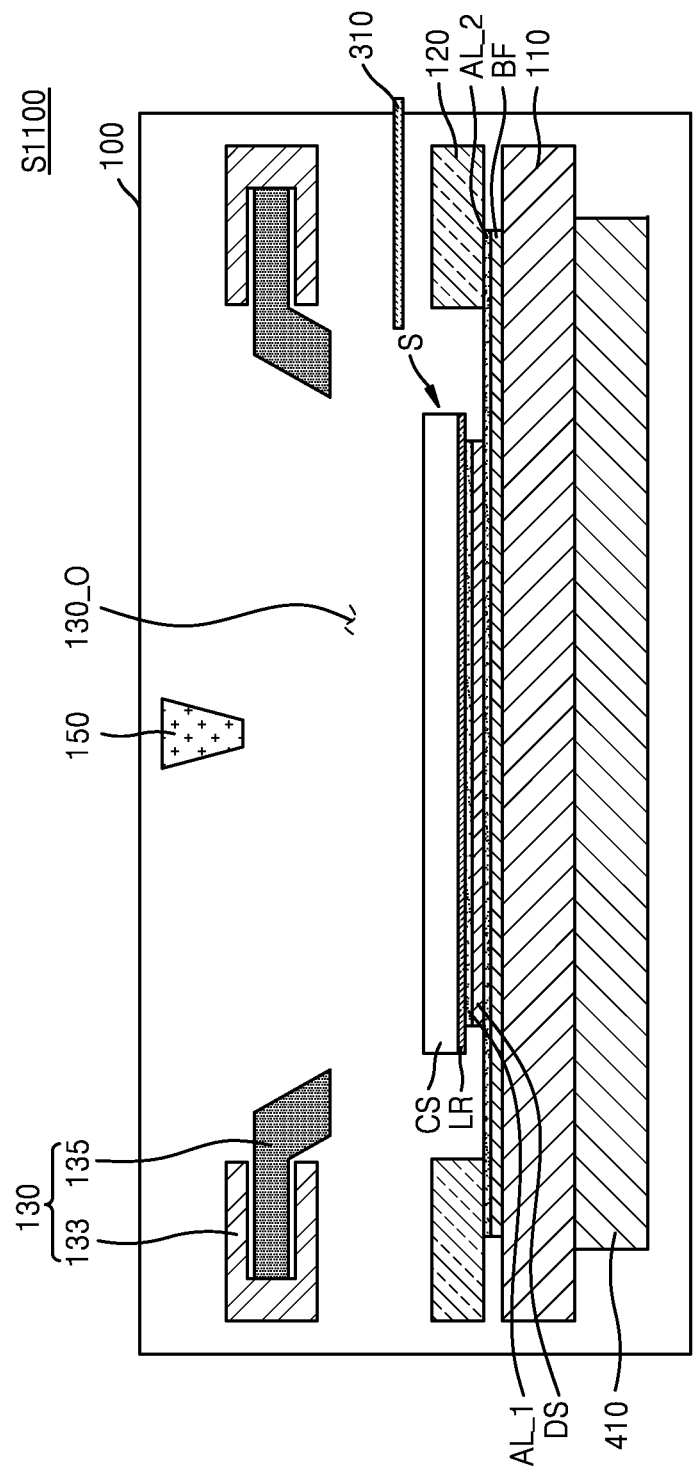
FIG. 13 is a view illustrating an operation of fixing a semiconductor device on a chuck, according to at least one embodiment of the inventive concept.

FIG. 13 is a view illustrating operation S1100 of fixing the semiconductor device S on the chuck 110 according to at least one embodiment of the inventive concept. Referring to FIGS. 12 and 13 together, the substrate debonding process S100 may include operation S1100 of fixing the semiconductor device S on the chuck 110. As described with reference to FIG. 1, the semiconductor device S may include the semiconductor substrate DS, the first adhesive layer AL_1, the laser-responsive layer LR, the carrier substrate CS, the second adhesive layer AL_2, and the base film BF.

In at least one embodiment, operation S1100 includes mounting the semiconductor device S on the chuck 110 and fixing an edge of the semiconductor device S through the fixing ring 120. For example, after the semiconductor device S is mounted on the chuck 110, the fixing ring 120 may move in the vertical direction (e.g., a direction toward an upper surface of the chuck 110) and may fix in position an edge of the second adhesive layer AL_2 of the semiconductor device S.

Figure 14:
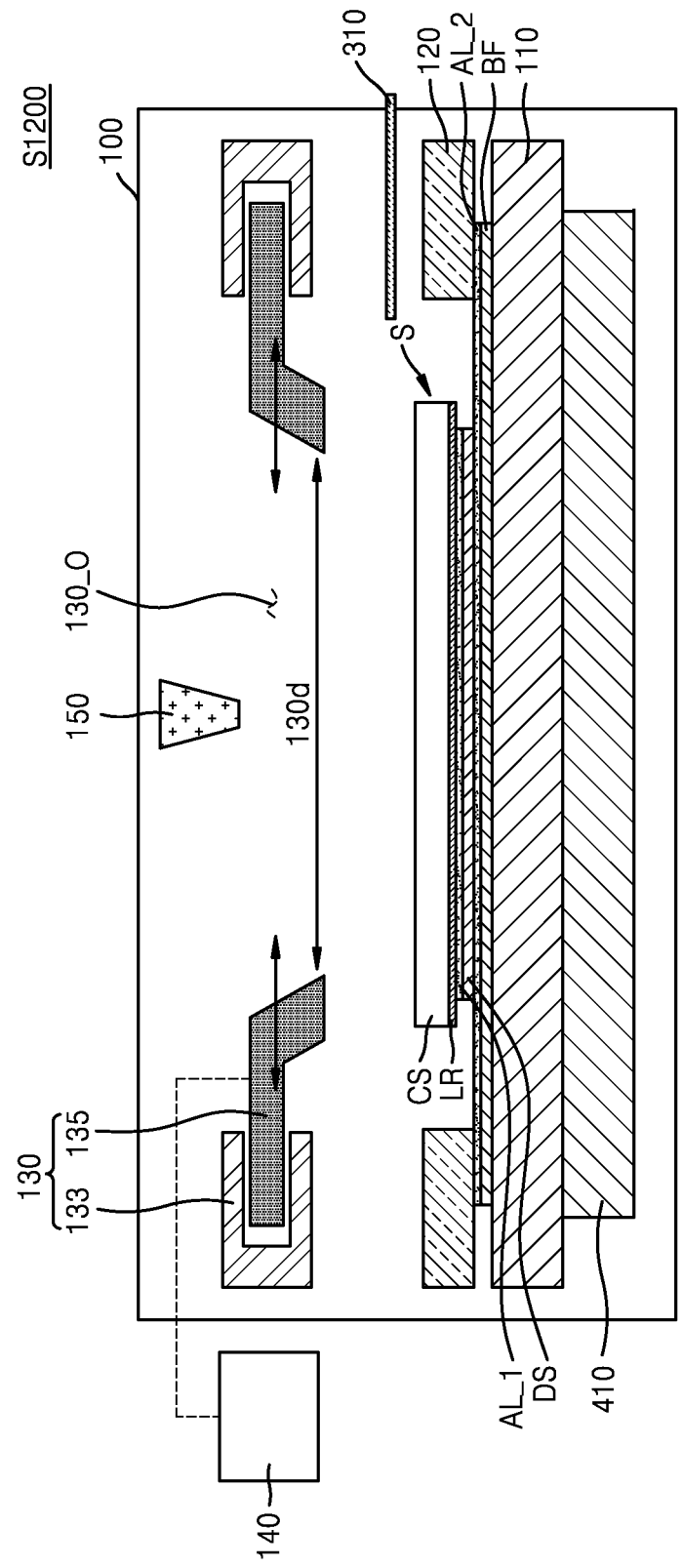
FIG. 14 is a view illustrating an operation of adjusting a size of a diameter of an opening of a cover ring, according to at least one embodiment of the inventive concept.

FIG. 14 is a view illustrating operation S1200 of adjusting the size of the diameter 130$d$ of the opening 130_O of the cover ring 130 according to at least one embodiment of the inventive concept. Referring to FIGS. 12 and 14 together, the substrate debonding process S100 may include operation S1200 of adjusting the size of the diameter 130$d$ of the opening 130_O of the cover ring 130.

In at least one embodiment, in operation S1200, the size of the diameter 130$d$ of the opening 130_O of the cover ring 130 is adjusted based on a size of the carrier substrate CS of the semiconductor device S mounted on the chuck 110. For example, when the substrate debonding apparatus 40 is viewed in a plan view, the diameter 130$d$ of the opening 130_O of the cover ring 130 may be adjusted such that the second adhesive layer AL_2 of the semiconductor device S is covered by the cover ring 130.

As described above, the cover ring 130 may be provided in a ring shape to include the guide frame 133 and the plurality of cover blades 135 configured to move in the horizontal direction determined by the guide frame 133. For example, the guide frame 133 may restrict vertical movement of the plurality of cover blades 135 such that the plurality of cover blades 135 may move in a horizontal direction and not a diagonal or vertical direction.

In at least one embodiment, the plurality of cover blades 135 include an aperture structure, and the diameter 130$d$ of the opening 130_O of the cover ring 130 may therefore be adjusted based on movement of the plurality of cover blades 135 in the horizontal direction determined by the guide frame 133. For example, the plurality of cover blades 135 may move in the horizontal direction determined by the guide frame 133 via the first driver 140.

In at least one embodiment, in operation S1200, when a diameter of the carrier substrate CS of the semiconductor device S mounted on the chuck 110 is provided as a first length, the plurality of cover blades 135 move a first distance in the horizontal direction determined by the guide frame 133. Accordingly, the cover ring 130 may include the first opening 130_O1 as described with reference to FIG. 5 including the first diameter 130d1 as described with reference to FIG. 5 that exposes the carrier substrate CS but does not expose the second adhesive layer AL_2 arranged outside the carrier substrate CS.

In at least one embodiment, in operation S1200, when the diameter of the carrier substrate CS of the semiconductor device S mounted on the chuck 110 is provided as a second length that is less than the first length, the plurality of cover blades 135 moves a second distance that is greater than the first distance in the horizontal direction determined by the guide frame 133. Accordingly, the cover ring 130 may include the second opening 130_O2 as described with reference to FIG. 6 including the second diameter 130d2 as described with reference to FIG. 6 that is less than the first diameter 130d1 and exposes the carrier substrate CS but does not expose the second adhesive layer AL_2 arranged outside the carrier substrate CS.

That is, the size of the opening 130_O through which the cover ring 130 of the substrate debonding apparatus 40 exposes the carrier substrate CS of the semiconductor device S may be adjusted. Accordingly, the substrate debonding process S100 may be applied to a substrate debonding process of a semiconductor device S provided in various sizes.

Figure 15:
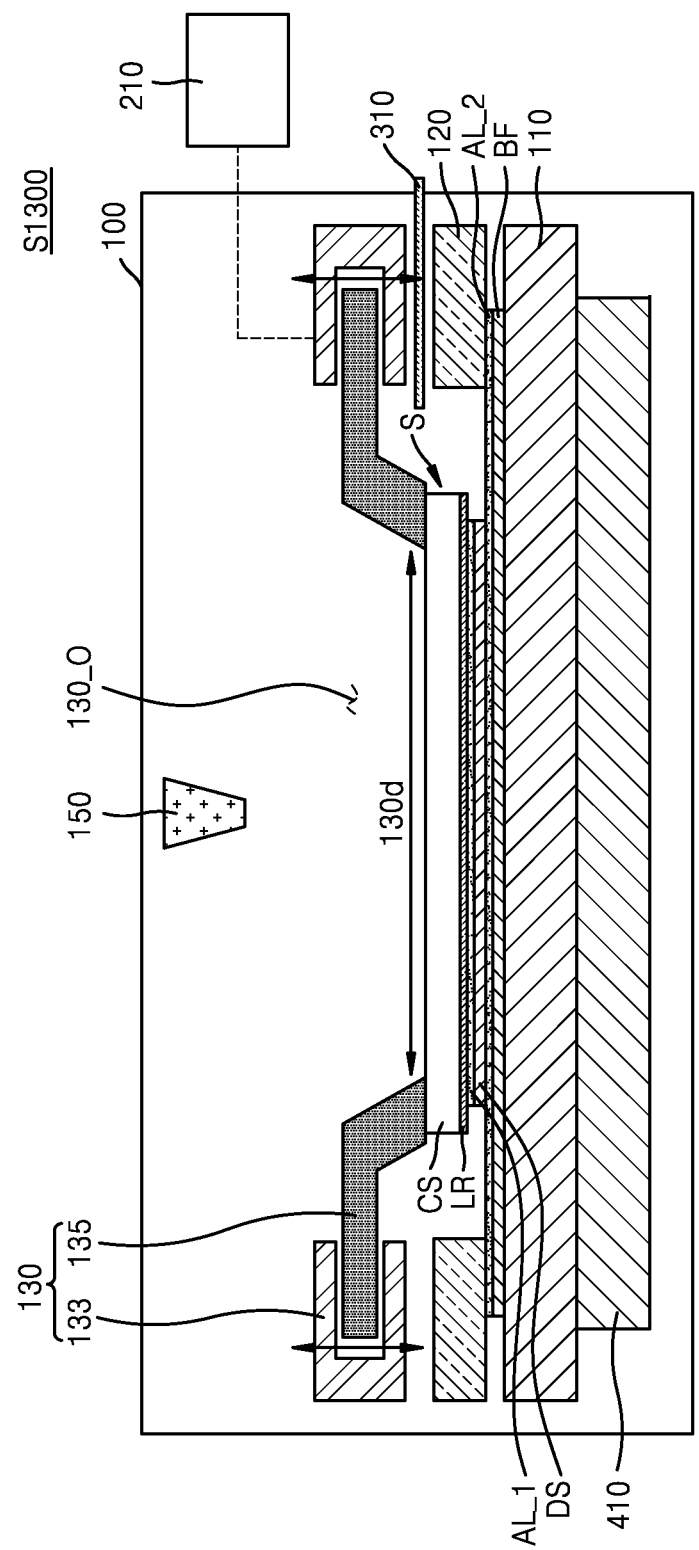
FIG. 15 is a view illustrating an operation of moving a cover ring in a vertical direction such that the cover ring comes into contact with a portion of a semiconductor device, according to at least one embodiment of the inventive concept.

FIG. 15 is a view illustrating operation S1300 of moving the cover ring 130 in the vertical direction such that the cover ring 130 comes into contact with a portion of the semiconductor device S according to at least one embodiment of the inventive concept. Referring to FIGS. 12 and 15 together, the substrate debonding process S100 may include operation S1300 of moving the cover ring 130 in the vertical direction such that the cover ring 130 comes into contact with a portion of the semiconductor device S.

In at least one embodiment, in operation S1300, the cover ring 130 moves in the vertical direction (e.g., a direction toward an upper surface of the chuck 110) via the second driver 210. In detail, the cover ring 130 may move in the vertical direction via the second driver 210 until a portion of the cover ring 130 is in contact with an edge portion of the carrier substrate CS of the semiconductor device S. In operation S1300, because a portion of the cover ring 130 of the substrate debonding apparatus 40 may fix in position the edge portion of the carrier substrate CS of the semiconductor device S, the carrier substrate CS may be prevented from slipping during horizontal movement of the stage 410.

Figure 16:
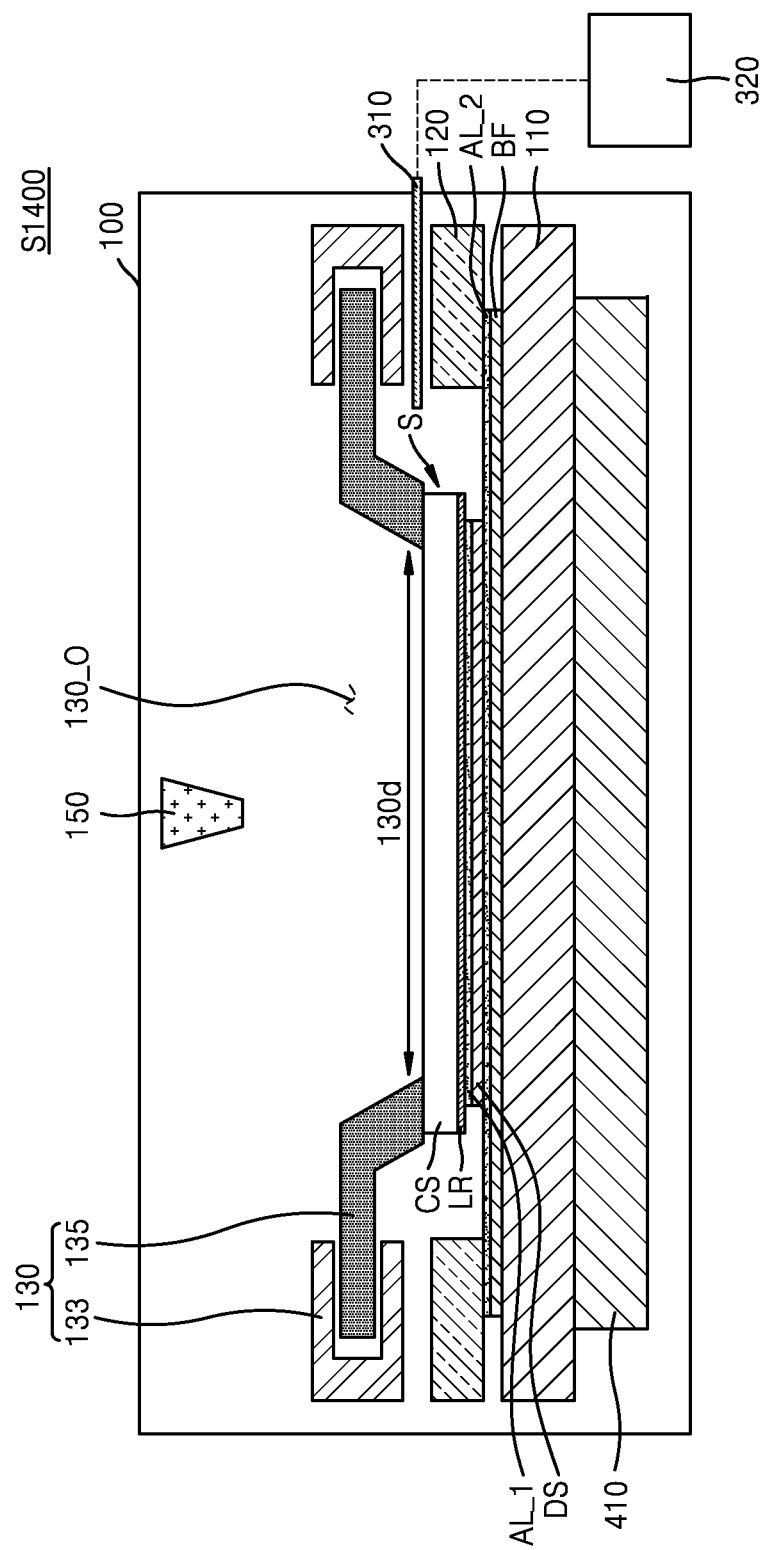
FIG. 16 is a view illustrating an operation of discharging air below a cover ring to the outside of a chamber, according to at least one embodiment of the inventive concept.

FIG. 16 is a view illustrating operation S1400 of discharging air below the cover ring 130 to outside of the chamber 100 according to at least one embodiment of the inventive concept. Referring to FIGS. 12 and 16 together, the substrate debonding process S100 may include operation S1400 of discharging air below the cover ring 130 to outside of the chamber 100.

For example, operation S1400 may include discharging the air below the cover ring 130 to outside of the chamber 100 such that pressure in a space provided below the cover ring 130 in the internal space of the chamber 100 is lower than pressure in the a space outside of the chamber 100.

In at least one embodiment, in operation S1400, the pump 320 provides suction pressure to the pipe 310 arranged below the cover ring 130. Accordingly, air present below the cover ring 130 may be discharged to the space outside of the chamber 100 through the pipe 310, and the pressure in the space provided below the cover ring 130 may be lower than the pressure in the space outside of the chamber 100.

In at least one embodiment, in operation S1400, because the pump 320 discharges air from a space between the fixing ring 120 and the cover ring 130 to the space outside of the chamber 100, particles P that may be formed after breaking a portion of the second adhesive layer AL_2 are discharged to the space outside of the chamber 100 through the pipe 310.

Accordingly, in an operation in which the light source 150 provides light to the semiconductor device S to separate the carrier substrate CS from the first adhesive layer AL_1, contamination of the carrier substrate CS and the components included in the substrate debonding apparatus 40 due to the particles P that may be generated as a result of the breaking of the second adhesive layer AL_2 may be reduced.

Figure 17:
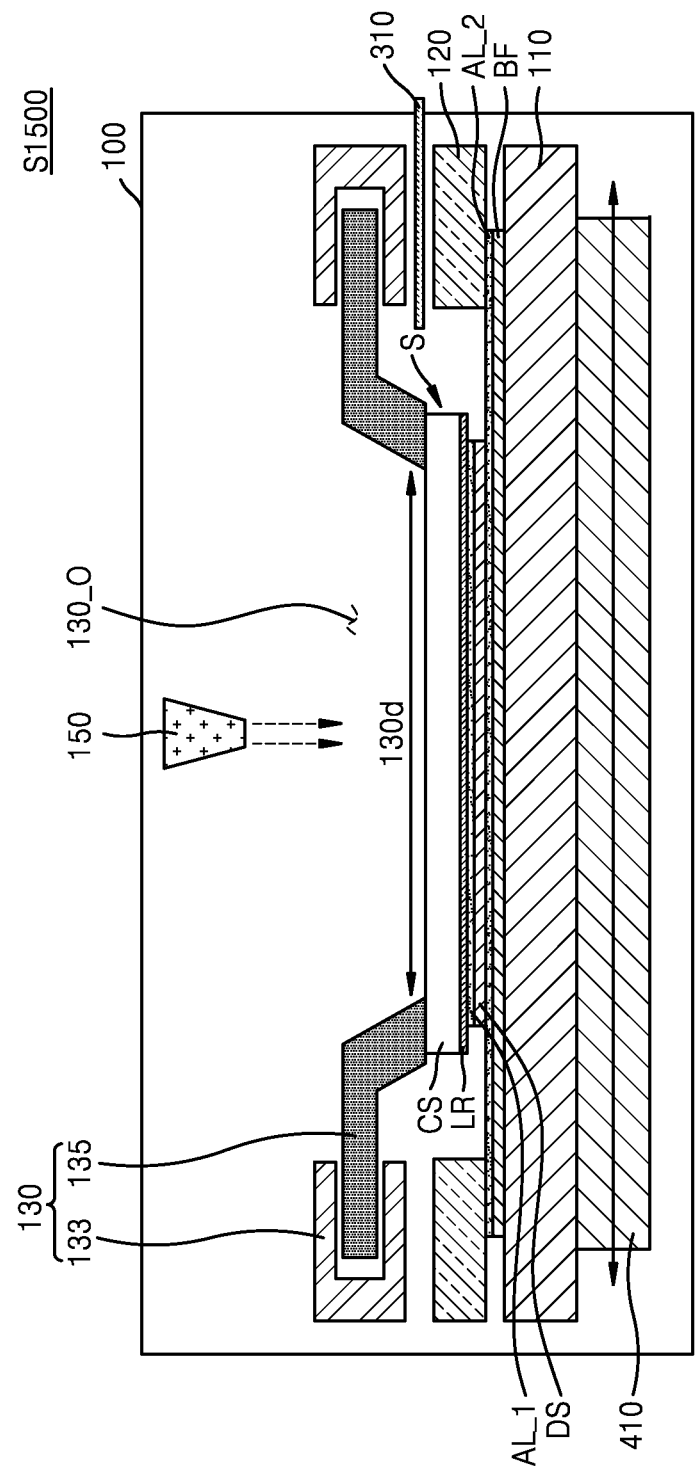
FIG. 17 is a view illustrating an operation of providing light to a semiconductor device, according to at least one embodiment of the inventive concept.

FIG. 17 is a view illustrating operation S1500 of providing light to the semiconductor device S, according to at least one embodiment of the inventive concept. Referring to FIGS. 12 and 17 together, the substrate debonding process S100 may include operation S1500 of providing light to the semiconductor device S.

In at least one embodiment, operation S1500 includes providing light from the light source 150 to the laser-responsive layer LR to separate the carrier substrate CS from the first adhesive layer AL_1. The laser-responsive layer LR of the semiconductor device S may include a material causing a photochemical reaction due to absorption of light by the material. For example, the laser-responsive layer LR may include a material that expands upon absorbing ultraviolet rays. When ultraviolet rays are irradiated onto the laser-responsive layer LR, expandable protrusions may be generated inside the laser-responsive layer LR. The expandable protrusions inside the laser-responsive layer LR may decrease adhesion between the first adhesive layer AL_1 and the carrier substrate CS.

In at least one embodiment, in operation S1500, the stage 410 is configured to move the semiconductor device S mounted on the chuck 110 in the horizontal direction while the light source 150 provides light to the laser-responsive layer LR of the semiconductor device S. Because the stage 410 may move the semiconductor device S in the horizontal direction, the light provided by the light source 150 may be provided to an entire region of the laser reaction layer LR.

In at least one embodiment, in operation S1500, the light provided by the light source 150 is blocked by the cover ring 130, and thus, may be prevented from reaching the second adhesive layer AL_2 and the base film BF exposed in the internal space of the chamber 100. Accordingly, a photochemical reaction of the base film BF due to the light provided by the light source 150 may be reduced, and a phenomenon in which particles P (as described with reference to FIG. 2) are produced after breaking the second adhesive layer AL_2 arranged on the base film BF as a result of the photochemical reaction of the base film BF may be reduced.

While the inventive concept has been particularly shown and described with reference to embodiments thereof, it will be understood that various changes in form and details may be made therein without departing from the spirit and scope of the present disclosure.

What is claimed is:

1. A substrate debonding apparatus configured to separate a carrier substrate of a semiconductor device from a first adhesive layer of the semiconductor device, the substrate debonding apparatus comprising:
   a chamber including an internal space;
   a chuck configured to support a base film of the semiconductor device in the internal space of the chamber, wherein the semiconductor device comprises: a semiconductor substrate including a first surface extending in a horizontal direction and a second surface opposite to the first surface and extending in the horizontal direction; the first adhesive layer; a laser-responsive layer arranged on the first adhesive layer; the carrier substrate; and a second adhesive layer arranged on the second surface and having a cross-sectional area in the horizontal direction greater than a cross-sectional area of the semiconductor substrate in the horizontal direction, wherein the first adhesive layer is arranged on the first surface of the semiconductor substrate, the carrier substrate is arranged on the laser-responsive layer, and the base film is arranged under the second adhesive layer;

a light source configured to provide light to the laser-responsive layer of the semiconductor device;

a fixing ring arranged above the chuck and configured to support an edge portion of the semiconductor device; and a cover ring arranged above the fixing ring and overlapping a portion of the second adhesive layer in a vertical direction perpendicular to the horizontal direction, the portion of the second adhesive layer arranged outside the carrier substrate, wherein the cover ring is configured to adjust a diameter of an opening exposing the carrier substrate and comprises: a guide frame arranged above the fixing ring; and a cover blade configured to move in a horizontal direction determined by the guide frame.

2. The substrate debonding apparatus of claim 1, further comprising a first driver configured to provide power for movement of the cover blade of the cover ring in the horizontal direction.

3. The substrate debonding apparatus of claim 1, wherein the cover blade of the cover ring comprises a plurality of cover blades, wherein the plurality of cover blades includes cover blades arranged on different layers in the vertical direction so as not to interfere with each other when moving in the horizontal direction determined by the guide frame, a portion of the plurality of cover blades including inner portions of the plurality of cover blades forms the opening of the cover ring, and a diameter of the opening is adjusted based on movement of the plurality of cover blades in the horizontal direction determined by the guide frame.

4. The substrate debonding apparatus of claim 1, further comprising a second driver configured to provide power for movement of the cover ring in the vertical direction.

5. The substrate debonding apparatus of claim 4, further comprising a buffer member arranged on a lower surface of the cover blade and contacting or spaced apart from a portion of the carrier substrate of the semiconductor device based on the movement of the cover ring in the vertical direction.

6. The substrate debonding apparatus of claim 1, further comprising:

a pipe arranged below the cover ring and connecting the internal space of the chamber to a space outside of the chamber; and a pump connected to the pipe and configured to provide suction pressure to the pipe.

7. The substrate debonding apparatus of claim 1, further comprising:

a first driver configured to provide power for movement of the cover blade of the cover ring in the horizontal direction;

a second driver configured to provide power for movement of the cover ring in the vertical direction;

a pipe arranged below the cover ring and connecting the internal space of the chamber to an external space of the chamber; and a pump connected to the pipe and configured to provide suction pressure to the pipe.

8. The substrate debonding apparatus of claim 7, further comprising a stage configured to move the chuck in the horizontal direction.

9. A substrate debonding apparatus configured to separate a carrier substrate from a first adhesive layer, the carrier substrate being attached to a first surface of a semiconductor substrate via the first adhesive layer, the substrate debonding apparatus comprising:

a chuck attached to a second surface opposite to the first surface of the semiconductor substrate via a second adhesive layer, and configured to support a lower portion of a base film having a cross-sectional area in a horizontal direction greater than a cross-sectional area of the semiconductor substrate in the horizontal direction;

a fixing ring arranged above the chuck and configured to fix in position an edge portion of the base film; and a cover ring arranged above the fixing ring and configured to adjust a diameter of an opening exposing the carrier substrate, wherein the cover ring comprises: a guide frame arranged above the fixing ring; and a plurality of cover blades configured to move in a horizontal direction determined by the guide frame.

10. The substrate debonding apparatus of claim 9, wherein cover blades of the plurality of cover blades are arranged on different layers so as not to interfere with each other when moving in the horizontal direction determined by the guide frame, and the substrate debonding apparatus further comprises a first driver configured to provide power for movement of the plurality of cover blades in the horizontal direction determined by the guide frame.

11. The substrate debonding apparatus of claim 9, further comprising:

a buffer member arranged on lower surfaces of the plurality of cover blades and contacting a portion of the carrier substrate; and a second driver configured to provide power for movement of the cover ring in a vertical direction perpendicular to the horizontal direction.

12. The substrate debonding apparatus of claim 9, further comprising:

a chamber including an internal space accommodating the chuck, the fixing ring, and the cover ring;

a pipe arranged below the cover ring and connecting the internal space of the chamber to a space outside of the chamber; and a pump connected to the pipe and configured to provide suction pressure to the pipe.

13. The substrate debonding apparatus of claim 12, further comprising:

a light source arranged above the chuck in the internal space of the chamber; and a stage arranged below the chuck and configured to move the chuck in the horizontal direction.

14. A substrate debonding apparatus configured to separate a carrier substrate from a first adhesive layer, the carrier substrate being attached to a first surface of a semiconductor substrate via the first adhesive layer, the substrate debonding apparatus comprising:

a chamber including an internal space;

a chuck attached to a second surface opposite to the first surface of the semiconductor substrate via a second adhesive layer, configured to support a lower portion of a base film having a cross-sectional area in a horizontal direction greater than a cross-sectional area of the semiconductor substrate in the horizontal direction, and arranged in the internal space of the chamber;

a fixing ring arranged above the chuck and configured to fix an edge portion of the base film;

a cover ring arranged above the fixing ring and overlapping a portion of the second adhesive layer in a vertical direction perpendicular to the horizontal direction, the portion of the second adhesive layer being provided outside the carrier substrate;

a pipe arranged below the cover ring and connecting the internal space of the chamber to a space outside of the chamber; and a pump connected to the pipe and configured to provide suction pressure to the pipe.

15. The substrate debonding apparatus of claim 14, wherein the cover ring comprises:

a guide frame provided in a ring shape above the fixing ring; and a plurality of cover blades configured to move in a horizontal direction determined by the guide frame, wherein the plurality of cover blades includes cover blades arranged on different layers so as not to interfere with each other when moving in the horizontal direction determined by the guide frame, inner portions of the plurality of cover blades form an opening, and a diameter of the opening is adjusted based on movement of the plurality of cover blades in the horizontal direction determined by the guide frame.

16. The substrate debonding apparatus of claim 15, further comprising a first driver configured to provide power for movement of the plurality of cover blades of the cover ring in the horizontal direction.

17. The substrate debonding apparatus of claim 16, further comprising a second driver configured to provide power for movement of the cover ring in the vertical direction.

18. The substrate debonding apparatus of claim 17, further comprising a buffer member arranged on lower surfaces of the plurality of cover blades and contacting or spaced apart from a portion of the carrier substrate based on movement of the cover ring in the vertical direction.

19. The substrate debonding apparatus of claim 14, further comprising a light source arranged above the chuck and configured to provide light to a laser-responsive layer between the first adhesive layer and the carrier substrate.

20. The substrate debonding apparatus of claim 19, further comprising a stage arranged below the chuck and configured to move the chuck in the horizontal direction while the light source provides light to the laser-responsive layer.

* * * * *